(12) United States Patent
Pan et al.

(10) Patent No.: US 8,914,574 B2
(45) Date of Patent: Dec. 16, 2014

(54) CONTENT ADDRESSABLE MEMORY AND METHOD OF SEARCHING DATA THEREOF

(75) Inventors: Yong Feng Pan, Shanghai (CN); Yufei Li, Shanghai (CN); Bo Fan, Beijing (CN); Liang Chen, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 13/372,869

(22) Filed: Feb. 14, 2012

(65) Prior Publication Data

US 2013/0046922 A1 Feb. 21, 2013

(30) Foreign Application Priority Data

Mar. 31, 2011 (CN) .......................... 2011 1 0081052

(51) Int. Cl.
- *G06F 12/00* (2006.01)
- *G06F 17/30* (2006.01)
- *G06F 12/08* (2006.01)

(52) U.S. Cl.
CPC .. *G06F 17/30982* (2013.01); *G06F 2212/1024* (2013.01); *G06F 12/0864* (2013.01); *G06F 12/0895* (2013.01); *G06F 17/3033* (2013.01)
USPC ............ 711/108; 711/118; 711/128; 711/136

(58) Field of Classification Search
CPC .......... G06F 17/3033; G06F 17/30982; G06F 12/0864; H04L 45/7457
See application file for complete search history.

(56) References Cited

U.S. PATENT DOCUMENTS

| | | | | |
|---|---|---|---|---|
| 5,530,958 | A | * | 6/1996 | Agarwal et al. .................... 711/3 |
| 6,052,698 | A | * | 4/2000 | Bennett et al. ........................ 1/1 |
| 6,308,220 | B1 | | 10/2001 | Mathur |
| 6,389,507 | B1 | | 5/2002 | Sherman |
| 6,560,670 | B1 | * | 5/2003 | Ichiriu ........................... 711/108 |

(Continued)

FOREIGN PATENT DOCUMENTS

CN 1673968 A 9/2005

OTHER PUBLICATIONS

Sangyeun Cho, Joel R. Martin, Ruibin Xu, Mohammad H. Hammoud, Rami Melhem, CA-RAM: A High Performance Memory Substrate for Search-Intensive Applications, Apr. 25-27, 2007 IEEE International Symposium on Performance Analysis of Systems & Software, pp. 230-241.*

(Continued)

*Primary Examiner* — April Y Blair
*Assistant Examiner* — Michael C Kolb
(74) *Attorney, Agent, or Firm* — Steven J. Meyers

(57) ABSTRACT

The present invention discloses a content addressable memory and a method of searching data thereof. The method includes generating a hash index data item from a received input data item; searching the cache for presence of a row tag of the RAM data row corresponding to the data item of hash index; in response to presence, searching the RAM for a RAM data item corresponding to the input data item according to the corresponding row tag of the RAM data row; in response to absence, searching the RAM for a RAM data item corresponding to the input data item by using the data item of hash index; and in response to finding a RAM data item corresponding to the input data item in the RAM, outputting data corresponding to the RAM data item. The method can accelerate data search in the CAM.

13 Claims, 6 Drawing Sheets

(56) References Cited

U.S. PATENT DOCUMENTS

| | | | |
|---|---|---|---|
| 7,171,439 | B2 | 1/2007 | Honig |
| 7,606,994 | B1* | 10/2009 | Cypher .................. 711/216 |
| 7,809,888 | B1* | 10/2010 | Clark et al. .................. 711/118 |
| 2004/0001492 | A1* | 1/2004 | Johnson .................. 370/395.32 |
| 2004/0221132 | A1* | 11/2004 | Torkelsson et al. ........... 711/210 |
| 2005/0182841 | A1* | 8/2005 | Sharp .................. 709/228 |
| 2006/0212426 | A1 | 9/2006 | Shakara et al. |
| 2008/0133494 | A1* | 6/2008 | Won-Kyoung et al. ........... 707/4 |
| 2008/0215849 | A1 | 9/2008 | Scott |
| 2009/0031044 | A1* | 1/2009 | Barrack et al. ................ 709/247 |
| 2009/0240875 | A1 | 9/2009 | Chu et al. |
| 2010/0040067 | A1* | 2/2010 | Hao et al. .................. 370/395.32 |

OTHER PUBLICATIONS

Song, et al., "Fast Has Table Lookup Using Extended Bloom Filter: An Aid to Network Processing" SIGCOMM 2005, Aug. 21-26, 2005, Philadelphia, PA, USA.

Pontarelli et al., "Error Detection and Correction in Content Addressable Memories," 2010 25th IEEE International Symposium on Defect and Fault Tolerance in VLSI Systems (DFT 2010) Location: Kyoto, Japan Date: Oct. 6-8, 2010.

Guccione, S.A. "A Reconfigurable Content Addressable Memory," Parallel and Distributed Processing, Proceedings Book Series: Lecture Notes in Computer Science vol. 1800 pp. 882-889 Published: 2000.

Cho et al., "CA-RAM: A High-Performance Memory Substrate for Search-Intensive Applications," 2007 IEEE International Symposium on Performance Analysis of Systems & Software, Apr. 25-27, 2007, pp. 230-241, San Jose, California DOI: 10.1109/ISPASS.2007.363753.

Gupta, R., "Victim Cache," AMRM: Project Technical Approach, Nov. 23, 1998 http://www.ics.uci.edu/~amrm/slides/amrm_structure/pta/sld046.htm.

Rojas-Cessa et al., "Parallel-Search Trie-Based Scheme for Fast IP Lookup," 2007 IEEE Global Telecommunications Conference, Nov. 26-30, 2007, pp. 210-214, © 2007 IEEE DOI: 10.1109/GLOCOM.2007.47.

Song et al., "Fast Hash Table Lookup Using Extended Bloom Filter: An Aid to Network Processing," Proceedings of the 2005 Conference on Applications, Technologies, Architectures, and Protocols for Computer Communications, Aug. 21-26, 2005, pp. 181-192, Philadelphia, Pennsylvania DOI: 10.1145/1080091.1080114.

Wikipedia, "Cache," Wikipedia, The Free Encyclopedia, last modified on Apr. 21, 2014 http://en.wikipedia.org/wiki/Cache.

\* cited by examiner

| HASH INDEX DATA ITEM | ROW TAG OF THE RAM DATA ROW |
|---|---|
| ... | ... |
| 134 | 256 |
| 136 | 259 |
| ... | ... |

*FIG. 3*

CONTENT ADDRESSABLE MEMORY AND METHOD OF SEARCHING DATA THEREOF

CROSS-REFERENCE TO RELATED APPLICATIONS

This application claims priority under 35 U.S.C. §119 from Chinese Patent Application No. 20110081052.2 filed Mar. 31, 2011, the entire contents of which are incorporated herein by reference.

TECHNICAL FIELD

The present invention generally relates to a memory structure, and more specifically, to a content addressable memory and a method of searching data thereof.

DESCRIPTION OF THE RELATED ART

Content-Addressable Memory (CAM) is a hardware module that either acts as a separate integrated circuit module or is embedded in another integrated circuit such as CPU. CAM is primarily used in a search intensive field, like MAC address table and routing table in network application, and data search in cache or the like.

CAM is a memory to be addressed with content. The main operating mechanism thereof is automatically and simultaneously comparing an input data item with all data items stored in the CAM to judge if the input data item is identical with the data items stored in the CAM. If there exists an identical data item, the CAM returns a list consisting of one or more addresses where the input data item is stored.

In CAM, there are respective separate comparing circuits for comparing bits of the input data item with bits of the stored data items; thus, the comparison speed is very fast. However, the number of connection lines of the respective data items within the CAM is the number of the bits of the data items to be compared. For example, if the data item has 64 bits, the number of the connection lines within the CAM is 8×64 if one data item is from input and 7 other data items are stored in the CAM. Such a design results in a relatively large circuit area. Furthermore, so many comparing circuits also result in relatively large power consumption. The cost of the overall CAM is relatively high.

Most of integrated circuit design tools provide traditional CAM modules designed using the above principle. As long as the designer inputs the bit worth of the data item and the number of the data items, the design tool can give a desired CAM module.

In order to reach a balance between speed, circuit area, power consumption and cost, researchers have proposed some improved solutions in which the standard tree search or hardware hash index is frequently applied. FIG. 1 illustratively shows an improved CAM design structure called CA-RAM (Sangyeun Cho et. Al, CA-RAM: A high-Performance Memory Substrate for Search-Intensive Applications, 2007 IEEE International Symposium on Performance Analysis of Systems and Software). In this design, RAM 10 stores RAM data items to be compared with the input data item in a manner of a structural storage form factor (i.e., array); a hardware hash index generating means 20 generates an R bits worth of index data item from the N bits worth of the input data item 30; a; after the hash indexing, rapid searching is preformed in the RAM approximating to the input data item is located; after the row is located, a plurality of comparators 40 compare the input data item with a plurality of data items in the row of the RAM and output respective comparison results; then a processor not shown in FIG. 1 combines the comparison results to obtain corresponding address items, and an outputting means 50 outputs address item results.

The index data item is compared with the RAM data items in the structural storage form factor of RAM firstly according to an index, in this way, the first RAM data row in the RAM the input data item can be rapidly located, then the input data item is compared with RAM data items in the row to reduce an amount of comparisons. In RAM, there can exist a case that although the hash index of RAM data items in a certain RAM data row is identical with that of the input data item, the data row does not contain the input data item, such a case is called a conflict by those skilled in the art. A method of solving the conflict in the above improved prior art is to extend the storage structure of one RAM data row in the RAM by adding a flag bit at the end of each RAM data row, the flag bit points to a next RAM data row to be indexed in the structural storage form factor of RAM, wherein a hash index of the RAM data items in above redirected RAM data row is identical with that of the RAM data items in the RAM data row. In this way, if a conflict happens, the comparison continues to the next RAM data row to which the flag bit points until the input data item is found; or the comparison continues to the next RAM data row to which the flag bit of the RAM data row is null, that means, the input data item is not found until the end of the index process, a result of not found is output.

In the above improved solution, conflicts still exist widely, so the searching speed of the CAM is decreased.

SUMMARY OF THE INVENTION

Thus, there is a need for a content addressable memory (CAM) and a method of searching data thereof capable of reducing conflicts during data search in the CAM and accelerating data search.

According to an aspect of the invention, a method of searching data in a content addressable memory is provided, in which the content addressable memory includes a RAM and a cache. The RAM stores a plurality of RAM data items by using an array structure. Each RAM data row in the array includes a row tag. The cache stores a searched correspondence relation between a hash index data item and the row tag of the RAM data row. The method includes generating a hash index data item from a received input data item; searching the cache for presence of a row tag of the RAM data row corresponding to the data item of hash index; in response to presence of the row tag of the RAM data row in the cache corresponding to the data item of hash index, searching the RAM for a RAM data item corresponding to the input data item according to the corresponding row tag of the RAM data row; in response to absence of the row tag of the RAM data row in the cache corresponding to the data item of hash index, searching the RAM for a RAM data item corresponding to the input data item by using the hash index data item; and in response to finding a RAM data item corresponding to the input data item in the RAM, outputting data corresponding to the RAM data item.

According to another aspect of the invention, a content addressable memory is provided which includes the following: a RAM configured to store a plurality of RAM data items by using an array, each RAM data row of the array comprising a row tag; a cache configured to store a previously searched correspondence relation between a hash index data item and the row tag of the RAM data row; a hash index generating means configured to generate a hash index data item from a received input data item;

a controller configured to control searching the cache for presence of a row tag of the RAM data row corresponding to the data item of hash index. The controller includes a searching means configured to, in response to presence of the row tag of the RAM data row in the cache corresponding to the data item of hash index, search the RAM for a RAM data item similar to the input data item according to the corresponding row tag of the RAM data row, and in response to absence of the row tag of the RAM data row corresponding to the data item of hash index, search the RAM for a RAM data item corresponding to the input data item by using the data item of hash index. Finally, the CAM also includes an outputting means configured to, in response to finding a RAM data item corresponding to the input data item in the RAM, output data corresponding to the RAM data item.

BRIEF DESCRIPTION OF THE DRAWINGS

By describing the exemplary embodiments of the invention in more detail in combination with the accompanying drawings, the above and other objects, features and advantages of the invention will be more apparent, wherein the same reference numeral generally denotes the same composite part in the exemplary embodiments of the invention.

FIG. 3 illustratively shows an example of a cache data structure using the data in the above example;

DETAILED DESCRIPTION OF THE PREFERRED EMBODIMENT

The preferred embodiments of the invention will be described in more detail below with reference to the accompanying drawings in which the preferred embodiments of the invention are shown. However, the invention can be implemented in various forms and shall not be construed as being limited by the embodiments illustrated here. In contrast, the embodiments are provided for making the invention more thorough and complete, and conveying the scope of the invention comprehensively to those skilled in the art.

In order to reduce conflicts in data search in the CAM, some solutions have been provided by the prior art, but conflicts still exist widely. Considering that the input data item of the CAM to be searched is often repeated, previous search results can be stored in a Cache, that is, a Cache is added to the CAM to store the previous search results; upon a new request to search the input data item is received, the Cache is firstly searched and then the RAM if no result is found in the Cache.

Figure 1:
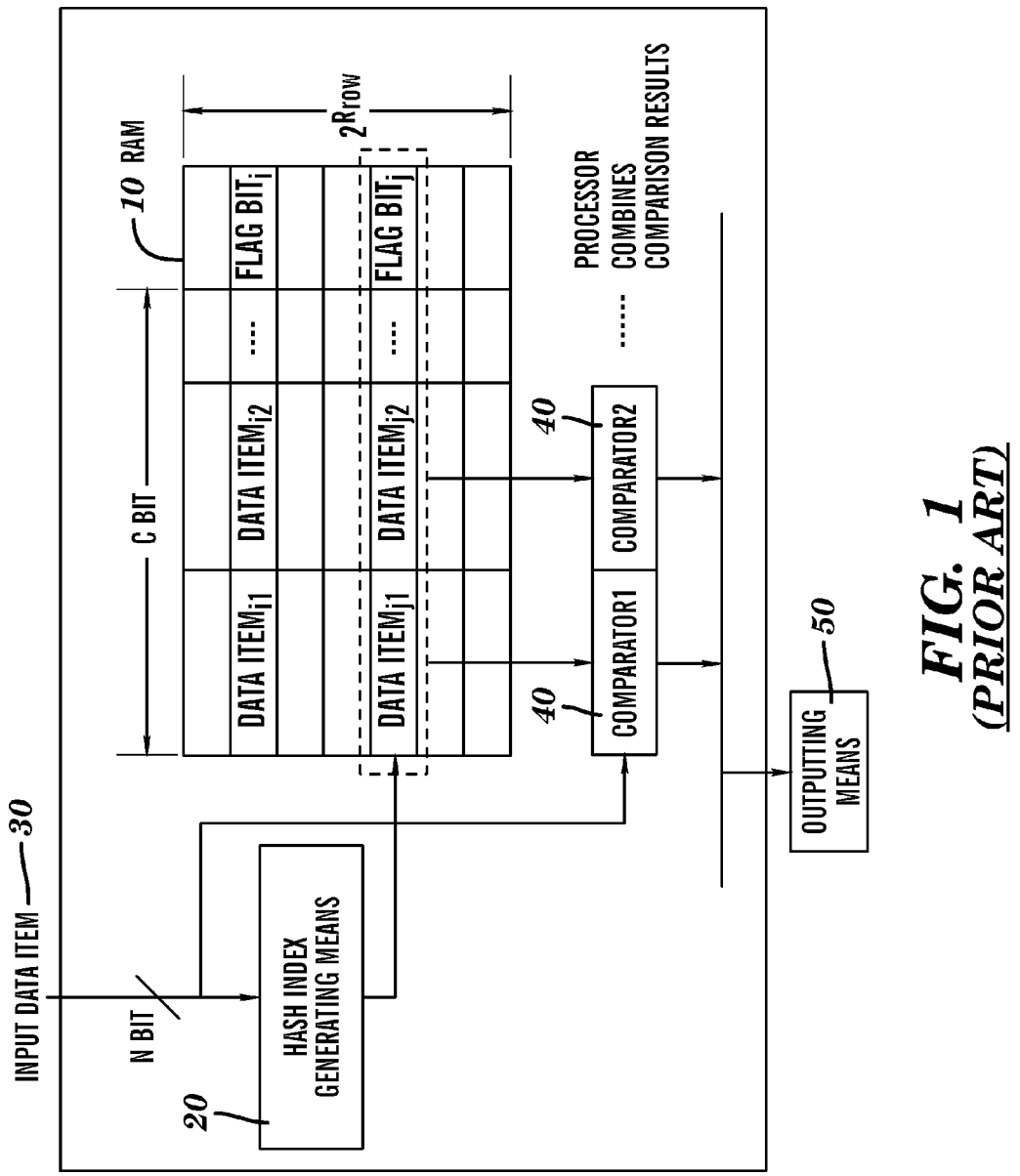
FIG. 1 illustratively shows a design structure of an improved prior art content addressable memory.
Figure 2:
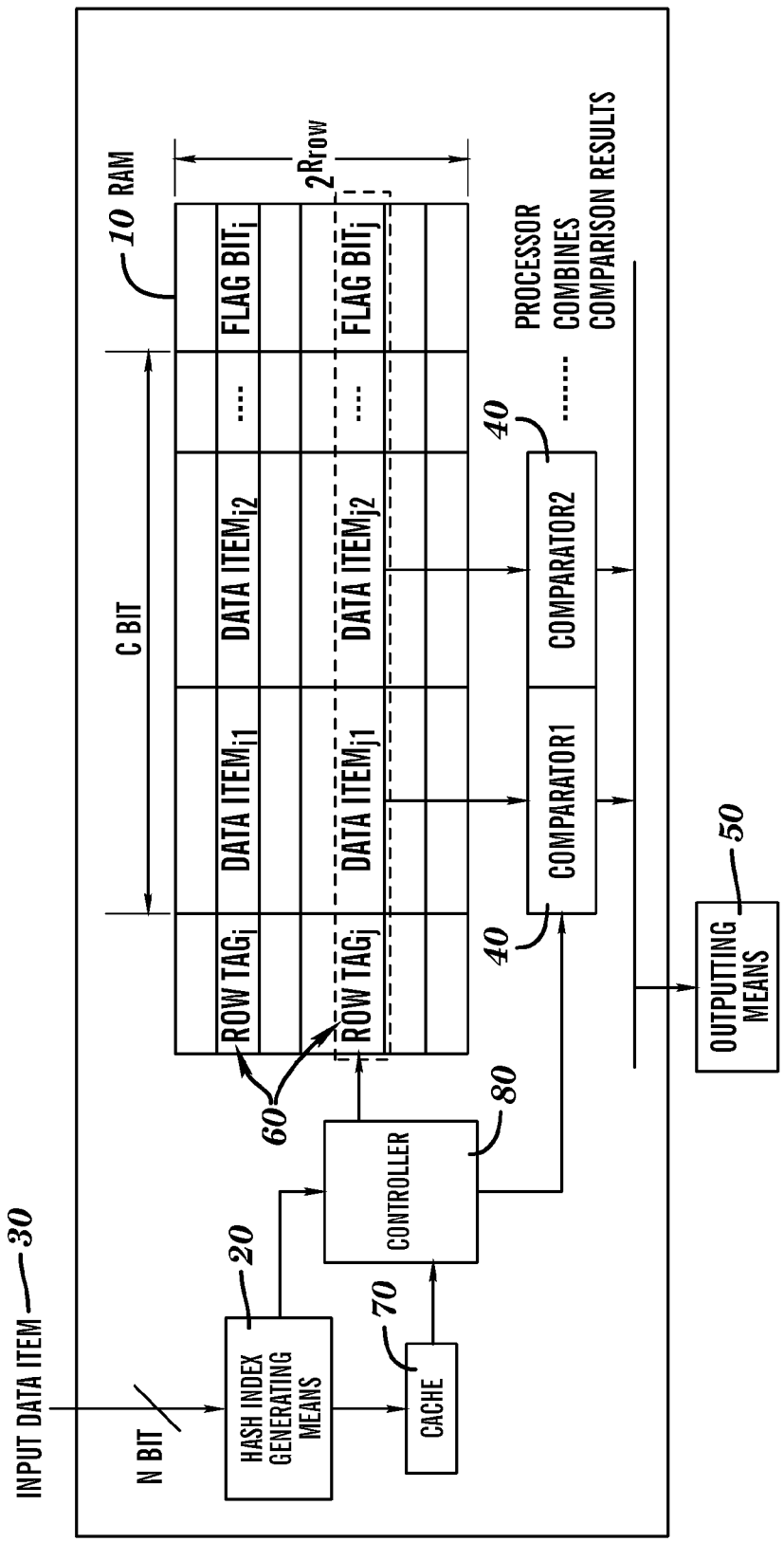
FIG. 2 illustratively shows a structure of an improved content addressable memory according to an embodiment of the present invention.

Therefore, the present invention discloses an improved content addressable memory (CAM). FIG. 2 illustratively shows structure of an improved content addressable memory according to an embodiment. As shown in FIG. 2, the content addressable memory includes the following:

a RAM 10 configured to store a plurality of RAM data items by using an array, each RAM data row of the array including a row tag 60;

a cache 70 configured to store a previously searched correspondence relation between a hash index data item and the row tag of the RAM data row;

a hash index generating means 20 configured to generate a hash index data item from a received input data item 30;

a controller 80 configured to control searching the cache for presence of a row tag of the RAM data row corresponding to the data item of hash index, wherein the search of the controller generally obtains results through comparison by hardware comparators, of course, other search modes are feasible, and the controller further includes: searching means (not shown in FIG. 2) configured to, in response to presence of the row tag of the RAM data row corresponding to the data item of hash index in the cache, search the RAM for a RAM data item corresponding to the input data item according to the corresponding row tag of the RAM data row, and in response to absence of the row tag of the RAM data row corresponding to the data item of hash index, search the RAM for a RAM data item corresponding to the input data item by using the data item of hash index; and an outputting means 50 configured to, in response to finding a RAM data item corresponding to the input data item in the RAM, output data corresponding to the RAM data item.

In the above embodiment, the data row of the RAM data items is expanded to include a row tag 60. In this way, the original next RAM data row flag bit in the data row can point to the row tag of the next RAM data row. In addition, if the storage capacity of the RAM is large enough, for example, if eDRAM is used, the data corresponding to the RAM data item can be directly stored in the RAM such that the data corresponding to the RAM data item can be rapidly output; if the capacity of the RAM is limited, another structure can be adopted to store the data corresponding to the RAM data item, which is available through the outputting means.

A specific example is provided throughout the present invention such that those skilled in the art can easily understand various embodiments of the present invention. In the example, it is assumed that the input data item is 11223344 and the data item of hash index generated by the hash index generating means is 134. The example will be used by subsequent embodiments to describe results of the embodiments.

In practice, the data structure in the Cache can be relatively flexible and designers can design how to store a searched correspondence relation between the data item of hash index and the row tag of the RAM data row as desired. In an embodiment, only a data table is used for storing the correspondence relation, wherein one column of the table is the searched hash index data item and the other column thereof is the corresponding row tag of the RAM data row. Various data structures such as linked list and array can also be used. In an embodiment, in order to accelerate the search in the Cache, an index can be further created for the stored correspondence relation between the data item of hash index and the row tag of the RAM data row. For example, the Cache stores data rows in manner of an array, the data row uses a part of the data item of hash index as an index of the Cache data row, each data row includes at least one hash index data item and a row tag of the RAM data row corresponding to the data item of hash index. Then the part of the data item of hash index is used as an index of the Cache data row, and the cache is rapidly searched for presence of a Cache data row corresponding to the data item of hash index, and in case of presence which is called hit in Cache, the row tag of the RAM data row corresponding to the data item of hash index is output. Otherwise, "absence of the row tag of the RAM data row corresponding to the data item of hash index in the cache" is output. In the above example, it is assumed that there are 100 rows in the Cache. FIG. 3 illustratively shows an example of the Cache data structure using the data in the above example, wherein the data item of hash index is data of 3 bits, and the last two bits are selected as the Cache index, so 34 and 36 are indexes of respective rows. Assuming that the data item of hash index 134 is searched in the Cache, the row in the Cache can be directly located to obtain the row tag 256 of the RAM data row.

Figure 4:
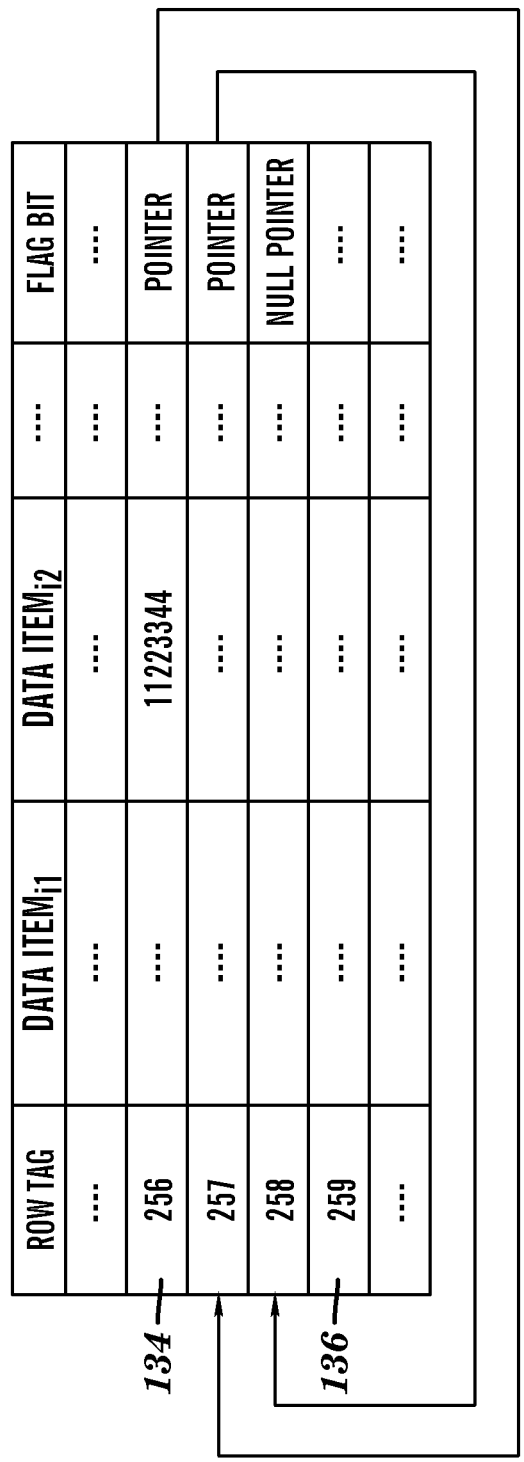
FIG. 4 shows an example of corresponding RAM data items in the RAM according to an embodiment of the present invention.

In fact, the controller is configured to control so as to firstly search the Cache for previous search results in the RAM for the input data item. In case of hit in Cache, the searching means of the controller can find the corresponding RAM data row in the RAM according to the corresponding row tag in the Cache, thereby find the data item identical with the input data item and find the corresponding data. FIG. 4 shows an example of the corresponding RAM data item in the RAM. As shown in FIG. 4, the RAM data items with the data item of hash index of 134 are in rows 256-258 of the RAM, the RAM data items with the data item of hash index of 136 start at the beginning of the row 259 of the RAM, and according to the row tag 256 of the RAM data row found in the Cache, the input data item 11223344 is found in the RAM data row with a row tag of 256, and the corresponding data is output.

Figure 5:
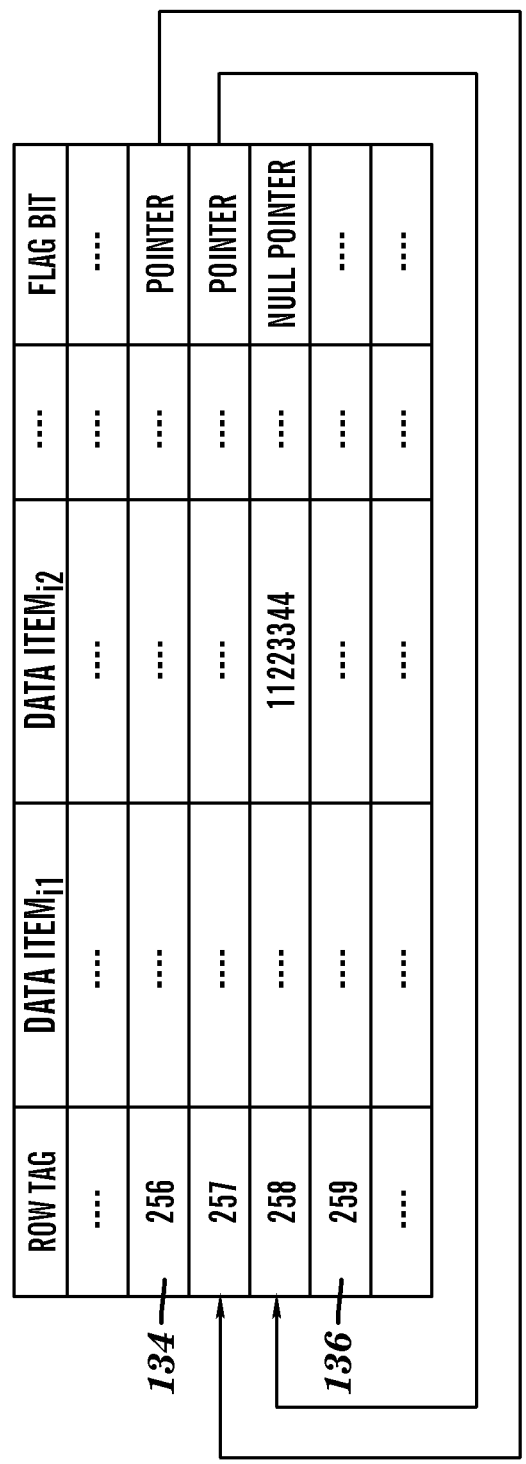
FIG. 5 shows an example that the data item in the RAM in FIG. 4 changes, assuming that the correspondence relation stored in the cache in FIG. 3 is unchanged.

However, sometimes, RAM data items in the RAM have been updated, thus, miss in Cache occurs. In this case, in response to not finding the RAM data item corresponding to the input data item from the RAM according to the corresponding row tag of the RAM data row, the controller deletes the correspondence relation between the data item of hash index and the corresponding row tag of the RAM data row from the cache; then outputs a result indicating absence of a row tag of the RAM data row corresponding to the data item of hash index in the cache. In this way, in response to absence of row tag of the RAM data row corresponding to the data item of hash index in the cache, the searching means of the controller can further search the RAM for the RAM data item corresponding to the input data item by using the data item of hash index. For example, FIG. 5 shows an example that the data item in the RAM in FIG. 4 changes, assuming that the correspondence relation stored in the Cache in FIG. 3 is unchanged. As shown in FIG. 5, the wrong correspondence relation in the Cache needs to be deleted according to the embodiment. The RAM is re-searched for the correspondence relation and the RAM data item corresponding to the input data item.

The searching means of the controller can adopt various ways to search the RAM data items in the RAM array, wherein specific searching ways are also associated with the contents of the RAM data rows. The RAM data row includes at least the row tag, a plurality of RAM data items and the next RAM data row flag bit. If there is enough space, the RAM data row can also store the data corresponding to the RAM and other extended items. If the searching means of the controller searches the RAM for the RAM data item corresponding to the input data item by using the data item of hash index, this shows that the search process in the Cache has failed, and at the time, the related correspondence relation in the Cache has been deleted. Search in the RAM is an iterative search process as follows: the searching means firstly uses the data item of hash index to locate the first RAM data row in the RAM, the hash index of the RAM data items in the first RAM data row is identical with the data item of hash index, so the hash index can rapidly locate a RAM data row having a hash index identical with the input data item. For the RAM data item example in FIG. 4, if the RAM data items in the first RAM data row (with a row tag of 256) include the input data item (11223344), the corresponding relation between the data item of hash index and the row tag of the first RAM data row in the RAM (the correspondence relation in FIG. 3) is added to the Cache, In this way, a new correspondence relation between the data item of hash index and the row tag of the first RAM data row in the RAM is reserved in the Cache again. If RAM data items in a certain RAM data row in the RAM do not include the input data item, wherein the hash index of the RAM data items in the certain RAM data row is identical with the data item of hash index, then a next RAM data row pointer at the end of the certain RAM data row is searched, wherein the next RAM data row pointer points to the row tag of the next RAM data row in the RAM, and the hash index of the RAM data items in the next RAM data row is identical with the data item of hash index. If the RAM data items in the next RAM data row include the input data item, the RAM data item corresponding to the input data item is found in the RAM. At the time, it is still needed to add to the Cache the correspondence relation between the data item of hash index and the row tag of the next data row in the RAM. For example, for the data items in the RAM in FIG. 5, the data row with the row tag of 256 is firstly located, the input data item is not found after searching, and it is determined that flag bit of the next RAM data row points to the data row with a row tag of 257, where the input data item still is not found after continued searching, after which it is determined that the flag bit of the next RAM data row points to the RAM data row with a row tag of 258, and after continued searching the input data item, the data item is found finally. At the time, the correspondence relation between 134 and 258 can be added to the Cache. In another embodiment, in the RAM, RAM data items in a certain RAM data row including the input data item can be exchanged with the RAM data items in the first RAM data row, then the correspondence relation between the data item of hash index and the row tag of the first RAM data row of the RAM is added to the cache. In this way, the RAM data items in the certain RAM data row including the input data item are always placed at the beginning of a number of RAM data items with the same hash index. In the above example, the RAM data items with a row tag of 256 are exchanged with the RAM data items with a row tag of 258, and the correspondence relation added to the Cache at the time is still 134 and 256. If the next RAM data row pointer at the end of the certain RAM data row is null, this shows that all the RAM data items whose hash index is the index data item have been searched, and a result indicating that no RAM data item corresponding to the input data item is found in the RAM is output. In the above example, if the input data item 11223344 is not found until a data row with a row tag of 258, it is determined that the RAM data item corresponding to the input data item is not found in the RAM.

In the above embodiment, if the Cache is large enough, it does not need to be updated and the searched correspondence relation can be always placed in the Cache. However, obviously, the capacity of the Cache generally is limited, so update of the contents in the Cache shall be taken into consideration. A step S612 in FIG. 6 relates to update of the Cache. When the correspondence relation is added to the Cache, if the Cache is not full, the searched correspondence relation between the data item of hash index and the row tag of the RAM data row in the RAM can be directly added to the cache; if the Cache is already full, prior to adding a new correspondence relation, the least used correspondence relation between hash index data item and the row tag of the RAM data row in the RAM contained in the Cache needs to be deleted. If the RAM data item corresponding to the input data item is not found in the RAM, cache updating methods currently used frequently can be adopted, which are omitted here.

Figure 6:
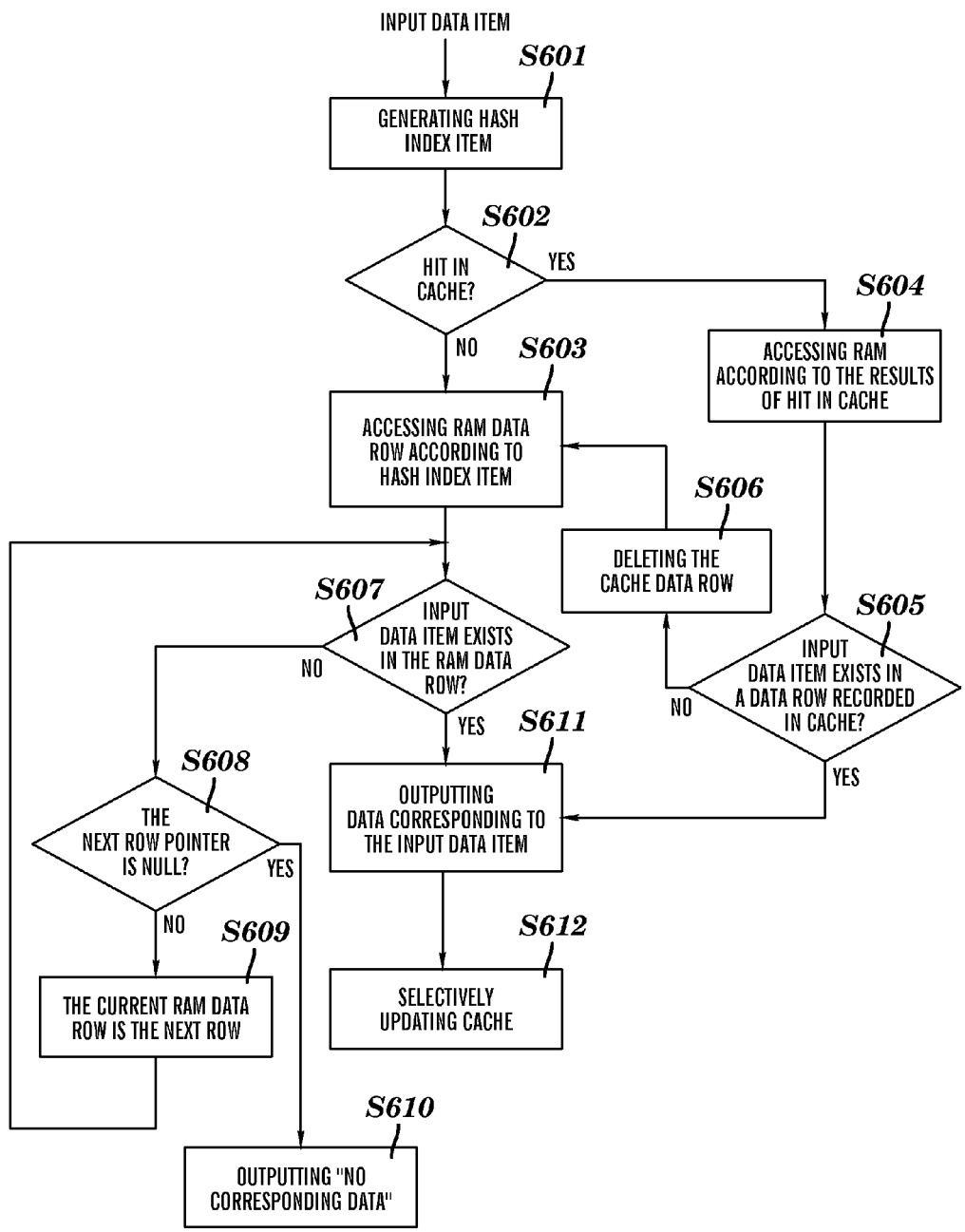
FIG. 6 illustratively shows a flowchart of a method of searching data in a content addressable memory according to an embodiment of the present invention.

Under the same inventive concept, the present invention also discloses a method of searching data in a content addressable memory, wherein the content addressable memory includes a RAM and a cache, the RAM stores a plurality of RAM data items by using an array, each RAM data row in the array includes a row tag, and the cache stores a searched correspondence relation between a hash index data item and the row tag of the RAM data row, the method including steps shown in FIG. 6: a step S601 of generating a hash index data item from a received input data item; a step S602 of searching the cache for presence of a row tag of the RAM data row corresponding to the data item of hash index, i.e., judging if a hit in Cache occurs; a step S604 of, in response to presence of the row tag of the RAM data row corresponding to the data item of hash index in the cache, i.e., in response to hit in Cache, searching the RAM for a RAM data item corresponding to the input data item according to the corresponding row tag of the RAM data row; a step S603 of, in response to absence of the row tag of the RAM data row corresponding to the data item of hash index, i.e., in response to miss in Cache, searching the RAM for a RAM data item corresponding to the input data item by using the data item of hash index; and a final step S611 of, in response to finding a RAM data item corresponding to the input data item in the RAM, outputting data corresponding to the RAM data item.

Either in the step S603 or in the step S604, the RAM needs to be entered to find the corresponding RAM data item. In the step S604, since the RAM data row at which the corresponding RAM data item locates has been obtained in the Cache, but the data row can be inaccurate, FIG. 6 further shows some preferred embodiments. If it is judged in a step S605 that the RAM data item corresponding to the input data item is not found from the RAM according to the corresponding row tag of the RAM data row in the Cache, then in a step S606, the correspondence relation between the data item of hash index and the corresponding row tag of the RAM data row is deleted from the cache; then the method can directly return to the step S603, or return to the step S602 by outputting a result indicating absence of the row tag of the RAM data row corresponding to the data item of hash index in the cache, thereby entering the step S603.

The step S603 can be implemented by using the prior art. The present invention also provides some preferred embodiments to improve the prior art. Firstly, in a step S607, the first RAM data row in the RAM can be located using the data item of hash index, the hash index of the RAM data items in the first RAM data row being identical with the data item of hash index; and if the RAM data items in the first RAM data row include the input data item, then in the step S611, the data corresponding to the RAM data item is output; preferably, in a step S612 of updating the Cache, the correspondence relation between the data item of hash index and the row tag of the first RAM data row in the RAM is added to the cache.

Since the first RAM data row possibly does not include the input data item, it can be judged in a step S608 whether the next RAM data row pointer at the end of the first data row is null, if it is not null, the method proceeds to a step S609 to locate the next RAM data row to which the flag bit at the end of the first RAM data row points and a judgment is made cyclically. Correspondingly, in FIG. 6, if it is determined in the step S607 that the RAM data items in a certain RAM data row in the RAM do not include the input data item, wherein the hash index of the RAM data items in the certain RAM data row is identical with the data item of hash index, then in the step S608, the next RAM data row pointer at the end of the certain RAM data row is searched, wherein the next RAM data row pointer points to the row tag of the next RAM data row in the RAM, and the hash index of the RAM data items in the next RAM data row is identical with the data item of hash index; if it is searched that the RAM data items in the next RAM data row include the input data item, then in the step S611, the data corresponding to the RAM data item is output, and in the step S612 of updating the cache, preferably, in the RAM, the RAM data items in the certain data row including the input data item are exchanged with the RAM data items in the first RAM data row. If it is judged in the step S608 that the next RAM data row pointer at the end of the certain RAM data row is null, then in a step S610, a result indicating that the RAM data item corresponding to the input data item is not found in the RAM is output.

The above embodiments have mentioned some policies to update the data rows in the Cache. Further updating policies include: in response to the cache not being full, directly adding to the cache the correspondence relation between the data item of hash index and the row tag of the RAM data row in the RAM; and in response to the cache being full, adding a new correspondence relation to the cache after deleting the least used correspondence relation between the data item of hash index and the row tag of a certain data row in the RAM contained in the cache.

In addition, in the judgment in the step S602, methods described before in the description can be adopted. Specifically, an index can be created on the data row in the Cache. One embodiment is: obtaining a part of the data item of hash index, wherein the Cache stores data rows in manner of an array, the data row uses the part of the data item of hash index as an index of the Cache data row, each data row includes at least one hash index data item and a row tag of the RAM data row corresponding to the data item of hash index; then searching the cache for presence of a Cache data row corresponding to the data item of hash index, in case of presence, outputting the row tag of the RAM data row corresponding to the data item of hash index; otherwise, outputting absence of the row tag of the RAM data row corresponding to the data item of hash index in the cache.

Although the exemplary embodiments of the invention have been described herewith reference to the accompanying drawings, it should be appreciated that, the invention is not limited to the exact embodiments, and various variations and amendments can be made to the embodiments by those skilled in the art without departing from the scope and spirit of the invention. All these variations and modifications are intended to be included in the scope of the invention as defined by the attached claims.

We claim:

1. A method of searching data in a content addressable memory-that includes a cache and a random access memory (RAM) that stores a plurality of RAM data items by using an array of RAM data rows having a row tag, the method comprising:

generating a first data item of hash index from a first input data item;

searching the cache for correspondence between a first row tag of a first RAM data row and the first data item of hash index;

in response to a cache hit for the first data item of hash index, searching the first RAM data row for a first RAM data item corresponding to the first input data item;

generating a second data item of hash index from a second input data item;

searching the cache for correspondence between a second row tag and the second data item of hash index;

in response to a cache miss for the second data item of hash index, searching the RAM for a second RAM data item corresponding to the second input data item by using the second data item of hash index; and in response to finding correspondence between the second RAM data item and the second input data item in the RAM, outputting data corresponding to the second RAM data item.

2. The method according to claim 1, further comprising:
in response to not finding a third RAM data item corresponding to a third input data item in the RAM:
deleting a correspondence relation between a third data item of hash index and a corresponding row tag of the RAM data row from the cache; and
outputting a result indicating absence of a row tag of the RAM data row corresponding to the third data item of hash index in the cache.

3. The method according to claim 1, wherein searching the cache for correspondence between the second row tag and the second data item of hash index comprises:
using the second data item of hash index to locate a particular RAM data row in the RAM having a hash index of RAM data items in the particular RAM data row that is identical with the second data item of hash index; and
in response to the data item of hash index of RAM data items in the particular RAM data row being identical with the second data item of hash index, adding a corresponding relation between the second data item of hash index and the row tag of the particular RAM data row in the RAM to the cache.

4. The method according to claim 1 wherein, searching the cache for correspondence between a second row tag and the second data item of hash index further comprises:
in response to RAM data items of a certain RAM data row in the RAM not comprising the input data item, while a hash index of the RAM data items in the certain RAM data row being identical with the second data item of hash index, searching a next RAM data row pointer at the end of the certain RAM data row, wherein the next RAM data row pointer points to a row tag of the next RAM data row in the RAM, and a hash index of the RAM data items in the next RAM data row is identical with the second data item of hash index; and
in response to the RAM data items in the next RAM data row comprising the second input data item, adding the correspondence relation between the second data item of hash index and the row tag of the next data row in the RAM to the cache.

5. The method according to claim 1 wherein, searching the cache for correspondence between a second row tag and the second data item of hash index further comprises:
in response to RAM data items of a certain RAM data row in the RAM not comprising the second input data item, while a hash index of the RAM data items of the certain RAM data row being identical with the second data item of hash index, searching a next RAM data row pointer at the end of the certain RAM data row, wherein the next RAM data row pointer points to a row tag of the next RAM data row in the RAM, and a hash index of RAM data items in the next RAM data row is identical to the second data item of hash index; and
in response to the RAM data items in the next RAM data row comprising the second input data item, exchanging in the RAM, the RAM data items of the next RAM data row comprising the second input data item with RAM data items of the second RAM data row, and adding a correspondence relation between the second data item of hash index and the row tag of the second RAM data row in the RAM to the cache.

6. The method of claim 1, further comprising, for the first data item of hash index using an existing correspondence relation stored in the cache as an index into the RAM at which to begin searching the RAM.

7. The method of claim 1, further comprising adding a particular correspondence relationship to the cache by:
determining that the cache is full;
removing, in response to determining that the cache is full, a least recently used correspondence relationship from the cache; and
adding the particular correspondence relationship to the cache.

8. A content addressable memory, comprising:
a random access memory (RAM) configured to store a plurality of RAM data items by using an array of RAM data rows, each RAM data row in the array including a row tag;
a cache configured to store a previously searched correspondence relation between a data item of hash index and a row tag of a corresponding RAM data row;
a hash index generator configured to generate a data item of hash index from a received input data item;
a controller configured to:
control searching of the cache for a correspondence between a row tag and the data item of hash index;
in response to finding the correspondence between a row tag of the RAM data row in the cache and the data item of hash index, search the RAM for a RAM data item corresponding to the received input data item according to the corresponding row tag of the RAM data row;
in response to not finding the correspondence between a row tag and the data item of hash index in the cache, search the RAM for a RAM data item corresponding to the received input data item by using the data item of hash index; and
in response to finding the RAM data item corresponding to the received input data item in the RAM, output data corresponding to the RAM data item.

9. The content addressable memory according to claim 8, wherein the controller is further configured to:
in response to not finding a RAM data item corresponding to the received input data item in the RAM, delete an existing correspondence relation between the data item of hash index and the corresponding row tag of the RAM data row from the cache, and output a result indicating absence of a row tag of the RAM data row corresponding to the data item of hash index in the cache.

10. The content addressable memory according to claim 8, wherein the controller is further configured to:
use the data item of hash index to locate a first RAM data row in the RAM, the hash index of the RAM data items in the first RAM data row being identical with the data item of hash index; and in response to the RAM data items in the first RAM data row comprising the received input data item, add a corresponding relation between the data item of hash index and the row tag of the first RAM data row in the RAM to the cache.

11. The content addressable memory according to claim 8, wherein the controller is further configured to:
in response to RAM data items in a certain RAM data row in the RAM not comprising the received input data item, while the hash index of the RAM data items in the certain RAM data row being identical with the data item of hash index, search a next RAM data row pointer at the end of the certain RAM data row, wherein the next RAM data row pointer points to the row tag of the next RAM data row in the RAM, and the hash index of the RAM data items in the next RAM data row is identical with the data item of hash index; and in response to the RAM data items in the next RAM data row comprising the received input data item, add a correspondence relation between the data item of hash index and the row tag of the next RAM data row in the RAM to the cache.

12. The content addressable memory according to claim 8, wherein the controller is further configured to: in response to RAM data items in a certain RAM data row in the RAM not comprising the received input data item, while the hash index of the RAM data items in the certain RAM data row being identical with the data item of hash index, search a next RAM data row pointer at the end of the certain RAM data row, wherein the next RAM data row pointer points to the row tag of the next RAM data row in the RAM, and the hash index of the RAM data items in the next RAM data row is identical with the data item of hash index; and in response to the RAM data items in the next RAM data row comprising the received input data item, exchange in the RAM, the RAM data items in the certain RAM data row comprising the received input data item with the RAM data items in the next RAM data row and add a correspondence relation between the data item of hash index and the row tag of the certain RAM data row in the RAM to the cache.

13. The content addressable memory according to claim 12, wherein the controller is further configured to: in response to the next RAM data row pointer at the end of the certain RAM data row being null, output a result indicating that no RAM data item corresponding to the received input data item is found in the RAM.

\* \* \* \* \*